(12) United States Patent
Lungu

(10) Patent No.: US 7,754,412 B2
(45) Date of Patent: Jul. 13, 2010

(54) PROCESS FOR PREPARING A FLEXOGRAPHIC PRINTING PLATE FROM A PHOTOPOLYMERIZABLE ELEMENT

(75) Inventor: Adrian Lungu, Old Bridge, NJ (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/344,019

(22) Filed: Jan. 31, 2006

(65) Prior Publication Data

US 2006/0160025 A1 Jul. 20, 2006

Related U.S. Application Data

(63) Continuation of application No. 09/839,803, filed on Apr. 20, 2001.

(51) Int. Cl.
*G03F 7/00* (2006.01)
*G03F 7/004* (2006.01)
*G03F 7/09* (2006.01)
*G03F 7/26* (2006.01)

(52) U.S. Cl. .................. 430/270.1; 430/302; 430/303; 430/309

(58) Field of Classification Search ................ 430/302, 430/303, 309, 394, 945, 944, 271.1, 270.1
See application file for complete search history.

(56) References Cited

U.S. PATENT DOCUMENTS

| | | | |
|---|---|---|---|
| 3,579,339 A | 5/1971 | Chang et al. |
| 4,033,773 A | 7/1977 | Lewis et al. |
| 4,139,390 A | 2/1979 | Rauner et al. |
| 4,251,619 A | 2/1981 | Kurita |
| 4,425,424 A | 1/1984 | Altland et al. |
| 4,499,304 A | 2/1985 | Gabrielsen et al. |
| 4,598,036 A | 7/1986 | Iwasaki et al. |
| 4,659,649 A | 4/1987 | Dickinson et al. |
| 4,714,751 A | 12/1987 | Schornick et al. |
| 4,857,438 A | 8/1989 | Loerzer et al. |
| 4,859,572 A | 8/1989 | Farid et al. |
| 4,891,301 A | 1/1990 | Aldag et al. |
| 4,940,649 A | 7/1990 | Aldag et al. |
| 4,962,011 A | 10/1990 | Aldag et al. |
| 5,006,447 A | 4/1991 | Umeda et al. |
| 5,030,548 A | 7/1991 | Fujikura et al. |
| 5,141,839 A | 8/1992 | Mitchell et al. |
| 5,204,222 A | 4/1993 | Gersdorf et al. |
| 5,204,227 A | 4/1993 | Larimer |
| 5,215,859 A | 6/1993 | Martens |
| 5,250,385 A | 10/1993 | Kondo et al. |
| 5,252,432 A | 10/1993 | Bach et al. |
| 5,346,805 A | 9/1994 | Kondo et al. |
| 5,441,850 A | 8/1995 | Marshall et al. |
| 5,445,917 A | 8/1995 | Grasshoff et al. |
| 5,472,824 A | 12/1995 | Schober et al. |
| 5,639,802 A | 6/1997 | Neckers et al. |
| 5,665,522 A | 9/1997 | Vogel et al. |
| 5,760,880 A * | 6/1998 | Fan et al. ...................... 355/67 |
| 5,792,879 A | 8/1998 | Gessner et al. |
| 5,798,202 A | 8/1998 | Cushner et al. |
| 5,804,353 A | 9/1998 | Cushner et al. |
| 5,942,554 A | 8/1999 | Ren et al. |
| 6,004,719 A | 12/1999 | Gaudiana et al. |
| 6,030,749 A | 2/2000 | Takahashi |
| 6,037,085 A | 3/2000 | Holman, III et al. |
| 6,037,101 A | 3/2000 | Telser et al. |
| 6,040,116 A | 3/2000 | Telser et al. |
| 6,133,336 A | 10/2000 | Popat et al. |
| 6,479,217 B1 * | 11/2002 | Grinevich et al. ........... 430/306 |

FOREIGN PATENT DOCUMENTS

| | | |
|---|---|---|
| DE | 41 29 279 A1 | 3/1992 |
| EP | 0511403 B1 | 11/1997 |
| EP | 1 241 002 A2 | 9/2002 |
| JP | 59-211036 | 11/1984 |

OTHER PUBLICATIONS

Monroe, Bruce M., Photopolymers: Radiation-Curable Imaging Systems, Radiation Curing: Science and Technology, 1992, 399-440, Chapter 10, Plenum Press, New York.
Patent Abstracts of Japan, Photopolymerizable Composition, JP 9 297398A, Nov. 18, 1997, vol. 1998, No. 3, Konica Corp.
Patent Abstracts of Japan, Photopolymerizable Composition, JP 01 013141 A, Jan. 18, 1989, vol. 0131, No. 85, Fuji Photo Film Co., Ltd.
English language abstract of Araki et al. (JP59-211036).
Decker et al., High Speed Photocrosslinking of Thermaoplastic Styrene-Butadiene Elastomers, Journal of Applied Polymer Science, vol. 77, 1902-1912, 2000.

* cited by examiner

*Primary Examiner*—Amanda C. Walke
(74) *Attorney, Agent, or Firm*—Thomas H. Magee

(57) ABSTRACT

This invention relates to a photosensitive element for use as a flexographic printing plate and a process for preparing the plate from the element. The photosensitive element has at least one photopolymerizable elastomeric layer that comprises a binder, a monomer, a photoinitiator, an onium salt, and a leuco dye. Upon exposure to actinic radiation, the onium salt and leuco dye react resulting in a change of color in polymerized portions of the photopolymerizable layer. The color change provides enhanced image color contrast in the photosensitive element.

1 Claim, No Drawings

PROCESS FOR PREPARING A FLEXOGRAPHIC PRINTING PLATE FROM A PHOTOPOLYMERIZABLE ELEMENT

BACKGROUND OF THE INVENTION

1. Field of the Invention

This invention relates to a photopolymerizable element for use as a flexographic printing plate and a process for preparing the plate from the element. The photopolymerizable element has at least one photopolymerizable elastomeric layer that comprises a binder, a monomer, a photoinitiator, an onium salt, and a leuco dye.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element. Flexographic printing plates are characterized by their ability to crosslink or cure upon exposure to actinic radiation. Typically, the plate is uniformly exposed through its backside, i.e., backflashed, to a specified amount of actinic radiation to form a floor. Next, the plate is imagewise exposed through its front side with the same actinic radiation that was used for the backflash exposure. The imagewise exposure is made through an image-bearing art-work or a template, such as a photographic negative or transparency (e.g. silver halide films), or through an in-situ mask having radiation opaque areas that had been previously formed above the photopolymerizable layer. The actinic radiation exposures can be conducted with ultraviolet (UV) or black light. The actinic radiation enters the photosensitive element through the clear areas and is blocked from entering the black or opaque areas of the tranparency or in-situ mask. The areas of the photopolymerizable layer that were exposed to the actinic radiation crosslink and harden and/or become insoluble to solvents used during development. The unexposed areas of the photopolymerizable layer that were under the opaque regions of the transparency or in-situ mask during exposure do not hardened and/or remain soluble. The unexposed areas are removed by treating with washout solutions or heat leaving a relief image suitable for printing. If treated with washout solutions, the plate is dried. The printing plate can be further exposed to complete polymerization and to remove surface tackiness. After all desired processing steps, the plate is then mounted on a cylinder and used for printing.

The above method for forming a flexographic printing plate from such a photosensitive element can be facilitated at the various steps described above by the ability to see the image created in the photopolymerizable layer. Typically the image cannot be easily seen in the photopolymerizable layer prior to forming the relief, and is in effect a latent image. A change in color in exposed areas of the photopolymerizable layer as a result of the imagewise exposure to actinic radiation would allow for easy visual observation of the image. One could readily determine at a glance if a plate has been imagewise exposed or not. Also, contrasting colors would easily distinguish the unexposed areas from the exposed areas. The plate having a color contrasting image could be preliminarily checked for the desired image and image quality prior to treating. The ability to check if a plate has been exposed and if it has the desired image is particularly useful in plate making shops where many plates are handled and may expose several plates prior to treating.

A change in color in the photopolymerizable layer as a result of imagewise exposure can also be an indicator that the photopolymerizable layer has been given desired imagewise exposure to form the relief. Too long of exposure of the element will overharden the polymerizable layer and ultimately cause cracking in the printing surface of the plate. If the plate is underexposed, the plate will not have desired relief necessary for flexographic printing.

Further, it would be desirable to maintain color contrast of the image after imagewise exposure and the treating step, as well as the subsequent exposure steps, to form the relief printing plate. It is advantageous for a flexographic printing plate to have contrasting color between the exposed (raised) areas and the floor (recessed) areas of the image. Color contrast of the print-ready flexographic printing plate is helpful for mounting of the plate on printing cylinder, particularly on printing presses having multiple stations where plates need to be mounted in register on multiple printing cylinders.

It is known to include dyes, particularly leuco dyes, in photopolymeric radiation curable systems to produce colored images in the exposed regions of the photopolymer. See "Photopolymers: Radiation Curable Imaging Systems," B. M. Monroe, in *Radiation Curing: Science and Technology*, Pappas, S. P., ed., Plenum Press, New York (1992). In this case, the photoinitiator system generally provides the free radicals necessary to convert the leuco dye to its color form. The leuco dye must then compete with the monomer/s for the free radicals in the photopolymerizable composition. A problem with this approach to provide color contrast, particularly for the elastomeric, relatively thick, photopolymerizable layer/s associated with flexographic printing elements, is that the leuco dye will not convert to its color form in the exposure time necessary to polymerize the exposed areas of the photopolymerizable layer.

U.S. Pat. No. 5,942,554 discloses a method for the formation of highly colored polymeric bodies which includes subjecting a curable composition containing a color precursor and an onium salt to heat or actinic radiation to cure the composition where the color precursor is converted to its colored form. The method provides for simultaneous color development and photopolymerization of curable films using a color precursor such as a lactone and an onium salt such as iodonium or sulfonium salt. In addition to the color precursor and the onuim salt, the curable composition includes curable compounds, such as free-radical curable and/or cation curable monomers. A photoinitator may optionally be present in the curable composition. However, only thin films up to 15 micron (0.59 mils) of the curable composition were disclosed. Prior to polymerization, the thin film is a liquid layer. There is no suggestion that the method is useful in a flexographic printing element having a photopolymerizable layer which is thick, that is greater than 20 mils (>508 micron), and is a solid elastomeric layer.

SUMMARY OF THE INVENTION

It is an object of the present invention to provide a photosensitive element for use as a flexographic printing plate that forms an image having contrasting color in an exposed area than in an unexposed area upon imagewise exposure to actinic radiation.

It is another object of the present invention to provide a process for making a flexographic printing plate from the photosensitive element having the contrasting color image so that the contrasting image is substantially retained throughout the process.

In accordance with this invention there is provided a photopolymerizable element for use as a flexographic printing plate comprising a support and a photopolymerizable layer on the support. The photopolymerizable layer comprising an elastomeric binder, at least one monomer, a photoinitiator, an onium salt and a leuco dye.

In accordance with another aspect of this invention there is provided a process for making a flexographic printing plate from the photosensitive element comprising imagewise exposing the photopolymerizable layer to actinic radiation forming polymerized portions and unpolymerized portions in the layer, and treating to remove the unpolymerized portions and form a relief surface suitable for printing.

DESCRIPTION OF THE PREFERRED EMBODIMENT(S)

The present invention concerns a photosensitive element and a process of using the photosensitive element to make a flexographic printing plate. The photosensitive element is in particular a photopolymerizable printing element having a photopolymerizable layer that includes an onium salt and a leuco dye which together photoinduce contrast and effectively differentiate exposed areas relative to unexposed (or underexposed) areas in an image. Upon exposure to actinic radiation the onium salt and the leuco dye react causing a change in color in the exposed areas compared to the unexposed areas and thus provide color contrast to the image. The image color contrast between the exposed areas and the unexposed areas in the element is retained prior to treating to form a relief for the plate. Preferably, the image contrast in color is also retained between the raised (exposed) areas of the relief and a floor of the plate after treating and throughout subsequent exposure steps, such as post-exposure and light finishing. The color contrast of the image in the element is useful during the steps of forming the relief plate from the element as well as for mounting of the plate onto printing cylinders. The photosensitive element of the present invention used for preparing flexographic printing plates comprises a support and at least one photopolymerizable layer. The photopolymerizable layer is an elastomeric layer that includes a thermoplastic binder, at least one monomer, a photoinitiator, the onium salt, and the leuco dye.

Unless otherwise indicated, the term "flexographic printing plate or element" encompasses plates or elements in any form suitable for flexographic printing, including, but not limited to, flat sheets and seamless continuous forms.

The support can be any flexible material that is conventionally used with photosensitive elements used to prepare flexographic printing plates. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. A preferred sleeve is a multiple layered sleeve as disclosed in U.S. Pat. No. 5,301,610. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve typically has a wall thickness from 10 to 80 mils (0.025 to 0.203 cm) or more. Prefered wall thickness for the cylinder form is 10 to 40 mils (0.025 to 0.10 cm).

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in Burg, U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a thermoplastic binder, at least one monomer, a photoinitiator, the onium salt and the leuco dye. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both.

The thermoplastic binder can be a single polymer or mixture of polymers. The thermoplastic binder preferably is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Preferred thermoplastic elastomeric binders are poly(styrene/isoprene/styrene) block copolymers and poly (styrene/butadiene/styrene) block copolymers. The non-elastomer to elastomer ratio of the A-B-A type block copolymers is preferably in the range of from 10:90 to 35:65. The thermoplastic binder can be soluble, swellable, or dispersible in aqueous, semi-aqueous, water, or organic solvent washout solutions. Elastomeric binders which can be washed out by treating in aqueous or semi-aqueous developers have been disclosed by Proskow, in U.S. Pat. No. 4,177,074; Proskow in U.S. Pat. No. 4,431,723; Worns in U.S. Pat. No. 4,517,279; Suzuki et al. in U.S. Pat. No. 5,679,485; Suzuki et al. in U.S. Pat. No. 5,830,621; and Sakurai et al. in U.S. Pat. No. 5,863,704. The block copolymers discussed in Chen, U.S. Pat. No. 4,323,636; Heinz et al., U.S. Pat. No. 4,430,417; and Toda et al., U.S. Pat. No. 4,045,231 can be washed out by treating in organic solvent solutions. Generally, the thermoplastic binders which are suitable for washout development are also suitable for use in thermal treating wherein the unpolymerized areas of the photopolymerizable layer soften, melt, or flow upon heating. It is preferred that the binder be present in an amount of at least 60% by weight of the photosensitive composition.

The term binder, as used herein, encompasses core shell microgels and blends of microgels and performed macromolecular polymers, such as those disclosed in Fryd et al., U.S. Pat. No. 4,956,252 and Quinn et al., U.S. Pat. No. 5,707,773.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Generally the monomers have relatively low molecular weights (less than about 30,000). Preferably, the monomers have a relatively low molecular weight less than about 5000. Examples of suitable monomers include, but are not limited to, t-butyl acrylate; lauryl acrylate; the acrylate and methacrylate mono- and poly-esters of alcohols and polyols such as alkanols, such as hexanediol diacrylate and hexanediol dimethacrylate; alkylene glycols, such as ethylene glycol diacrylate, ethylene glycol dimethacrylate, and diethylene glycol diacrylate; trimethylol propane, such as trimethylol propane triacrylate; ethoxylated trimethylol propane; pentaerythritol; dipentaerythritol; polyacrylol oligomers; and the like. If a polyacrylol oligomer is used, the oligomer should preferably have a molecular weight greater than 1000. A mixture of monofunctional and multifunctional acrylates or methacrylates may be used. Other examples of suitable monomers include acrylate and methacrylate derivatives of isocyanates, esters, epoxides and the like. Further examples of monomers include acrylated liquid polyisoprenes, acrylated liquid polybutadienes, liquid polyisoprenes with high vinyl content, and liquid polybutadienes with high vinyl content, (that is, content of 1-2 vinyl groups is greater than 20% by weight). Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The at least one compound capable of addition polymerization (i.e., monomer) is present in at least an amount of 5%, preferably 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophenone, dialkoxy acetophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, benzoyl oxime esters, thioxanthrones, comphorquinones, ketocoumarins, and Michler's ketone may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm. A second photoinitiator sensitive to radiation between 220 to 300 nm, preferably 245 to 265 nm, may optionally be present in the photopolymerizable composition. After treating, a plate can be finished with radiation between 220 to 300 nm to detackify the relief surfaces. The second photoinitiator decreases the finishing exposure time necessary to detackify the plate. Photoinitiators are generally present in amounts from 0.001% to 10.0% based on the weight of the photopolymerizable composition.

The photopolymerizable composition includes the onium salt and the leuco dye which function together to provide contrasting color to the image in the photosensitive element upon imagewise exposure to actinic radiation. The color contrast of the image is photoinduced such that the areas of the photopolymerizable layer which are exposed to actinic radiation change color and thus contrast with the unexposed or underexposed areas. The onium salt is sensitive to the same or substantially the same wavelength of actinic radiation at which the photopolymerization reaction occurs. Exposure to a certain amount of actinic radiation causes the onium salt to generate an acid that reacts with the leuco dye. The reacted leuco dye changes to its color form and thereby changes the color of the polymerized portions relative to the unpolymerized portions of the photopolymerizable layer. The presence of the onium salt provides the Lewis acid necessary for the leuco dye to convert to its color form without competing with the free radicals necessary for polymerization to occur. The photoinduced color formation occurs independent of the photoinduced polymerization reaction of the photoinitiator with the monomer or monomers. Color formation may or may not be induced during each exposure conducted to polymerize the photopolymerizable layer.

The onium salt comprises a strongly oxidizing cation paired with a nonnucleophilic anion. Onium salts suitable for use include phosphonium salts, selenonium salts, triarylselenonium salts, aryldiazonium salts, iodonium salts, diaryliodonium salts, sulfonium salts, triarylsulphonium salts, dialkylphenacylsulphonium salts, triarylsulphoxonium salts, aryloxydiarylsulphoxonium salts, dialkylphenacylsulphoxonium salts, and combinations thereof. Preferred onium salts are sulfonium salts, phosphonium salts, and iodonium salts. The counter ion of the onium salt is a non-nucleophilic anion. Suitable non-nucleophilic anions to the onium salts include tetrafluoro borate ($BF_4^-$), hexafluoro phosphate ($PF_6^-$), hexafluoro arsenate ($AsF_6^-$), hexafluoro antimonate ($SBF_6^-$). The onium salt can be a combination of any cation with any anion.

The onium salt is sensitive to the same or substantially the same wavelength of radiation as the photoinitiator for the exposure used to polymerize the photopolymerizable layer. Since the photoinitiator is preferably sensitive to actinic radiation in the ultraviolet and/or visible region, the onium salt is also sensitive to wavelength in the region of 310 to 400 nm, preferably 345 to 365 nm, most preferably 354 nm. In addition to its sensitivity to actinic radiation, the onium salt may also be sensitive to heat that may induce the reaction to occur with the leuco dye. Although heat may be naturally generated by the conditions during exposure, it is preferred that the onium salt be induced primarilly by actinic radiation to form the acid that reacts with the leuco dye. The onium salt is present in the photopolymerizable composition in greater effective amount than the effective amount of the leuco dye, so that the leuco dye is completely reacted or substantially completely reacted with the onium salt during the main imagewise exposure of the element. After the main exposure, no or substantially no leuco dye is available to react with the excess onium salt. Thus any further change in color contrast should not occur when the element is post-exposed. Preferably, the amount of the onium salt is at least twice the effective amount of the leuco dye. The onium salt is present in the photopolymerizable composition from 0.2 to 0.6% by weight, preferably 0.25 to 0.5% by weight, based upon the total weight of the components in the photopolymerizable layer.

The leuco dye reacts with the acid of the onium salt and converts to its color form to provide color to the exposed portions of the photopolymerizable layer. The leuco dye is colorless or only slightly color prior to conversion to its color form. The color form of the leuco dye should be in the visible region of the spectrum so that the change in color can be observed. Examples of leuco dyes include, but are not limited to, aminotriarylmethane compounds, aminoxanthene compounds, aminophenoxazine compounds, aminodihydrophenazine compounds, aminodiphenylmethane compounds, leucoindamine compounds, hydrazines, leuco indigoid dyes, amino-2,3-dihydroanthraquinones, tetrahyhalo-p,p'-bihenols, 2-(p-hydroxyphenyl)-4,5-diphenylimidazoles, and pheneethylaniline compounds. Preferred are cyclic lactone dyes, which include, but are not limited to, aminotriarylmethane compounds, amino-2,3-dihydroanthraquinones, and tetrahyhalo-p,p'-bihenols. Particularly preferred cyclic lactone dyes are aminotriarylmethane compounds. Examples of suitable aminotriarylmethane compounds can be found in U.S. Pat. No. 4,857,438 column 3, line 8 through column 5, line 33. Particularly preferred cyclic lactone dyes include:

6'-(diethylamino)-3'-methyl-2'-(phenylamino) spiro(isobenzofuran-1(3H), 9'-(9H)xanthen)-3-one;

2'-di(phenylmethyl) amino-6'-(diethylamino)spiro(isobenzofuran-1(3H), 9'-(9H)xanthen)-3-one;

6-(dimethylamino)-3,3-bis(4-dimethylamino)phenyl-1(3H)-isobenzofuranone;

6-(dimethylamino)-3,3-bis[4-(dimethylamino)phenyl]-1(3H)-isobenzofuranone (crystal violet lactone-CAS No. 1552-42-7);

2'-[bis(phenylmethyl)amino]-6'-diethylaminospirobenzofuran-1(3H), 9'-[9H]xanthen]-3-one (green dye precursor CAS No. 34372-72-0);

3-[bis(4-octylphenyl)amino]-3-[4-dimethylamino)phenyl]-3(3H)-izobenzofuranone (orange dye precursor CAS No. 67697-75-0); and 3,3-bis(1-butyl-2-methyl-1H-indol-3-yl)-1(3H)-izobenzofuranone (magenta dye precursor CAS No. 50292-91-6).

The leuco dye is present in the photopolymerizable composition from 0.1 to 0.3% by weight, preferably 0.12 to 0.25% by weight, based upon the total weight of the components in the photopolymerizable layer.

Since photoinduced color formation can occur at substantially the same time as free-radical polymerization of the photoinitiator occurs, leuco dyes having a color form that may interfere with the transmission of the actinic radiation to the photoinitiator should be avoided. As such leuco dyes that have a color form which is black or very dark, such as dark brown, should be avoided. Further, the leuco dye as well as the color form of the leuco dye should have minimal absorption to the radiation at which polymerization occurs.

Given the same photopolymerizable composition, the amount of the leuco dye, as well as the corresponding amount of onium salt, may need to be adjusted generally within the stated range to compensate for different thicknesses of the photopolymerizable layer. Also, the effective amount of the leuco dye and the onium salt may need to be adjusted in photopolymerizable compositions that include components which have an acid functionality.

To prepare a flexographic printing plate from the photpolymerizable element, the element is exposed to actinic radiation between 310 and 400 nm, for each of the main imagewise exposure, backflash exposure, and post-exposure. Generally, the time of the main imagewise exposure is longer than the backflash exposure and post-exposure. Color formation may or may not be induced to occur during each such exposure used to polymerize the photopolymerizable layer or portions thereof. Due to the presence of the onium salt and leuco dye, color formation will at least occur as a result of the main imagewise exposure so that the color contrast between the exposed areas and the unexposed areas of the photopolymerizable layer can be seen. Color formation may also occur as a result of backflash exposures and/or the post-exposure, but is not desired since the relief image of the plate will not have contrasting color to aid in plate mounting on printing cylinders. Preferably, color formation does not occur as a result of the backflash exposure and post-exposure, so that the relief image has contrast in color between the raised polymerized areas and the floor of the plate. The thickness and the solid nature of the elastomeric photopolymerizable layer hinder the energy from the exposure from inducing the reaction of the onium salt with the leuco dye. Such that, color formation is delayed relative to photopolymerization, but still occurs, during the main exposure time. Also color formation may not occur during the short backflash exposure and post-exposure times, since sufficient exposure energy may not be reached to induce the color change. For elements having a photopolymerizable layer greater than about 112 mils (0.28 cm) and the onium salt and leuco dye in the stated range, the exposure energy is about 2.0 Joules/cm$^2$ in order to reach the threshold in which photoinduced color change of the onium salt with the leuco dye begins. For elements less than 112 mils (0.28 cm) the threshold energy is about 1.0 Joules/cm$^2$. In order for the floor of the element not to change color and thereby contrast with the raised areas of the relief, the total amount of energy of both the backflash exposure and the post-exposure should be less than the threshold energy. It is possible to select a combination of the amount of the leuco dye (and onium salt), photopolymerizable layer thickness, and/or exposure times in which photoinduced color change occurs at substantially the same time that polymerization occurs for each exposure.

Since the leuco dye is converted to its color form during the same imagewise exposure that the exposed areas of the photopolymerizable layer polymerize, the change in color of the exposed areas, i.e., color contrast, can also be an indicator that the photopolymerizable layer has been given sufficient imagewise exposure. Observation of visual color contrast in the element would avoid over exposing as well as underexposing the element during the main exposure. The amount of lueco dye is determined so that it is completely consumed by the acid of the onium salt within the imagewise exposure time for optimum polymerization of the photopolymerizable layer.

The photopolymerizable composition may also contain an inert dye to provide the unexposed "raw" plate, i.e., photopolymerizable printing element, with a characteristic color. The reaction of the onium salt with the leuco dye will generate a color form of the leuco dye in those portions of the photopolymerizable layer which were exposed to radiation. If the inert dye and the color form of the leuco dye are too similar in color, the color of the exposed areas and the color of the unexposed areas will not be differentiated enough to provide sufficient contrast to the image. In order to take best advantage of the present invention of providing enhanced color contrast for the photosensitive element, the inert dye and/or the leuco dye should be chosen in order to enhance the color differentiation and provide the desired color contrast between the exposed areas and unexposed (and/or underexposed) areas of the photopolymerizable layer.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, and fillers. Sensitizers can be used to enhance the color effect in various color formation systems. Although the present photopolymerizable composition may include a sensitizer, it is preferred not include a sensitizer in the composition. The onium salt and leuco dye alone in the photopolymerizable composition provide sufficient color contrast to the exposed areas of the element. Processing aids may include low molecular weight polymers compatible with the elastomeric block copolymer, such as low molecular weight alpha-methylstyrene polymers or copolymers. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; liquid polyisoprene; polystyrene; poly-alpha-methyl styrene; alpha-methylstyrene-vinyltoluene copolymers; pentaerythritol ester of hydrogenated rosin; polyterpene resins; and ester resins. Generally, plasticizers are liquids having molecular weights of less than about 5000, but can have molecular weights up to about 30,000. Plasticizers having low molecular weight will encompass molecular weights less than about 30,000.

The thickness of the photopolymerizable layer can vary over a wide range depending upon the type of printing plate desired, for example, from about 0.020 inches to about 0.250 inches or greater (about 0.05 cm to about 0.64 cm or greater). For so-called "thin plates" typically the photopolymerization layer can range from about 0.020 inches to about 0.067 inches (about 0.05 cm to about 0.17 cm) in thickness. Thin plates can also encompass photopolymerizable layers about 0.112 inches (0.28 cm). Thicker plates can have a photopolymerizable layer of about 0.112 inches to about 0.250 inches or greater (0.28 cm to about 0.64 cm or greater).

The photopolymerizable layer itself can be prepared in many ways by admixing the binder, monomer, initiator, onium salt, leuco dye, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet. Generally, the use of onium salts and leuco dyes that are sensitive to heat should be avoided when the photopolymerizable layer is formed into a hot melt and calendered to prevent premature color formation of the element. Alternatively, the photopolymerizable material can be placed between the support and the temporary coversheet in a mold. The layers of material are then pressed flat by the application of heat and/or pressure. Cylindrical seamless photopolymerizable elements may be prepared according to the method and apparatus disclosed by Cushner et al. in U.S. Pat. No. 5,798,019.

The photosensitive element includes at least one photopolymerizable layer that can be of a bi- or multi-layer construction. Further, the photosensitive element may include an elastomeric capping layer on the at least one photopolymerizable layer. The elastomeric capping layer should have an elastic modulus in the polymerized state not substantially less than the elastic modulus of the photopolymerizable layer in the exposed state. The composition of the elastomeric layer comprises an elastomeric polymeric binder, a second onium salt and a second leuco dye. Both the second onium salt and the second leuco dye can be the same or different than the onium salt and the leuco dye in the photopolymerizable layer. A second polymeric binder and a nonmigratory dye or pigment can optionally be present in the elastomeric capping layer. The elastomeric composition can also contain a monomer or monomers and a photoinitiating system. The elastomeric polymeric binder in the elastomeric composition is generally the same as or similar to the elastomeric binder present in the photopolymerizable layer. The elastomeric capping layer is typically part of a multilayer cover element that becomes part of the photosensitive printing element during calendering of the photopolymerizable layer. The thickness of the elastomeric capping layer is typically 1.5 to 3.0 mils (38.1 to 76.2 micron), preferably 1.8 to 2.8 mils (45.7 to 71.1 micron). Such multilayer cover elements and compositions suitable as the elastomeric capping layer are disclosed in Gruetzmacher et al., U.S. Pat. Nos. 4,427,759 and 4,460,675. Although the elastomeric capping layer may not necessarily contain photoreactive components, the layer ultimately becomes photosensitive when in contact with the photopolymerizable layer. As such, upon imagewise exposure to actinic radiation, the elastomeric capping layer has portions in which polymerization or crosslinking have occurred and portions which remain unpolymerized, i.e., uncrosslinked. Treating with washout solutions or heat causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate.

The present photosensitive printing element may further comprise one or more additional layers on the at least one photopolymerizable layer. Additional layers on the photopolymerizable layer include release layer, an actinic radiation opaque layer, a barrier layer, and a layer which alters the surface characteristics of the photosensitive element. One additional layer may provide multiple functions for the photosensitive element. One or more of the additional layers can cover the photopolymerizable layer. If the actinic radiation opaque layer is present, at least one barrier layer may be interposed between the photopolymerizable layer and the radiation opaque layer. If present, the barrier layer minimizes migration of materials between the photopolymerizable layer and the radiation opaque layer. Monomers and plasticizers can migrate over time if they are compatible with the materials in an adjacent layer. Such migration can occur, for example, from the photopolymerizable layer into the radiation opaque layer. In such instances, the infrared sensitivity of the radiation opaque layer may be altered. In addition, such migration can cause smearing and tackifying of the radiation opaque layer after imaging.

Since the surface of the photopolymerizable layer may be tacky, a release layer having a substantially non-tacky surface can be applied to the surface of the photopolymerizable layer. Such release layer can protect the surface of the photopolymerizable layer from being damaged during removal of an optional temporary coversheet and can ensure that the photopolymerizable layer does not stick to the coversheet. During image exposure, the release layer can prevent the image-bearing mask from binding with the photopolymerizable layer. The release layer is insensitive to actinic radiation. The release layer is also suitable as a first embodiment of the barrier layer which is optionally interposed between the photopolymerizable layer and the actinic radiation opaque layer. The elastomeric capping layer may also function as a second embodiment of the barrier layer. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof.

The photosensitive printing element may further include the actinic radiation opaque layer disposed above a surface of the photopolymerizable layer opposite the support. The actinic radiation opaque layer may substantially cover the surface or only cover an imageable portion of the photopolymerizable layer. The actinic radiation opaque layer is substantially opaque to actinic radiation and preferably is sensitive to infrared radiation. The actinic radiation opaque layer can be used with or without the barrier layer. If used with the barrier layer, the barrier layer is disposed between the photopolymerizable layer and the radiation opaque layer. The actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the infrared-sensitive layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The actinic radiation opaque layer is employed in digital direct-to-plate image technology in which laser radiation, typically infrared laser radiation, is used to form a mask of the image for the photosensitive element (instead of the conventional image transparency or phototool). Digital methods create a mask image in situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The method by which the mask is formed with the radiation opaque layer on the photosensitive element is not limited. The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another digital method of mask formation, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer as disclosed by Fan et al. in U.S. Pat. No. 5,607,814; and Blanchett in U.S. Pat. Nos. 5,766, 819; 5,840,463; and EP 0 891 877 A. As a result of the imagewise transfer process, only the transferred portions of the radiation opaque layer will reside on the photosensitive element forming the in-situ mask.

It is also contemplated that digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier and then transferring with application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is imagewise exposed to laser radiation to selectively remove the radiation opaque material and form the image.

It is also possible to use more than one additional layers or types of layer. For example, an elastomeric capping layer may be present next to the photopolymerizable layer and this, in turn, may be overcoated with a release layer. The exact choice of additional layer(s) will depend on the nature of the photopolymerizable layer, whether or not the actinic radiation opaque layer is present, the nature of the radiation opaque layer and other physical requirements of the photosensitive element.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 5-mil Mylar®.

In preparation for the next step of the process which is to overall expose the photosensitive element to actinic radiation through a mask, an in-situ mask image may need to be formed on or disposed above the surface of the photopolymerizable layer opposite the support. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The image necessary for the imagewise exposure of the photopolymerizable layer can be generated by any method including conventional and digital methods, including inkjet application.

The infrared laser exposure can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask images remain on the photosensitive element for subsequent steps of overall exposure to actinic radiation and treating.

The next step of the process of the present invention is to overall expose the photosensitive element to actinic radiation through a mask, that is, imagewise exposure of the element. If the digital mask was formed in-situ on the photosensitive element, the element is overall exposed through the in-situ mask image.

Alternatively, a conventional method for imagewise exposure is by using an image-bearing transparency film or phototool, typically a silver halide film, as the mask. Typically, the phototool includes the image on a polyester base that is 5 to 7 mils thick. The image-bearing transparency film is placed on the release layer, a vacuum is pulled to assure good contact of the mask film to the element, and the element is exposed. The image-bearing transparency film is removed from the element prior to treating.

The photosensitive element of the present invention is exposed through the mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° to about 35° C. Exposure is of sufficient duration to crosslink the exposed areas down to the support or to the back exposed layer, i.e., floor, and to convert the leuco dye into its color form to change the color in the exposed areas. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the flexographic printing plates, as well as the photosensitivity of the onium salt and leuco dye used to provide color contrast. The preferred photosensitivity of most common flexographic printing plates are in the UV and deep UV area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. Flexographic printing plates sensitive to these particular UV sources use photoinitiators that absorb between 310-400 nm.

Imagewise exposure of the photosensitive element to actinic radiation may be conducted in the presence or absence of atmospheric oxygen for photosensitive elements having an in situ mask. Atmospheric oxygen is eliminated when the exposure is conducted in a vacuum. The exposure may be conducted in a vacuum to minimize the effects of oxygen on the polymerization reactions occurring in that layer. The exposure may be conducted in the presence of atmospheric oxygen since the mask is formed in situ or applied imagewise with radiation opaque material on the photopolymerizable layer, there is no need for vacuum to assure intimate contact of the in-situ mask. In the process of preparing a digital flexographic printing plate or sleeve, the overall exposure step preferably is conducted without vacuum, i.e., while the photosensitive element is in the presence of atmospheric oxygen, and without any additional layers present on top of the in-situ mask. For photosensitive elements that are exposed through an image transparency, the exposure must be conducted in vacuum to assure good contact between the image transparency and the photosensitive element.

The process of the invention usually includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes.

Since the time for backflash exposure is relatively short (compared to the exposure time of the imagewise exposure), the photosensitive element is not given a sufficient amount of radiation during backflash to induce the photoreaction of the onium salt and leuco dye. Thus the element is "underexposed" relative to the photoinduced reaction of the onium salt and the leuco dye, even though the backflash exposure is suitable to polymerize and form a floor in the photopolymerizable layer. The leuco dye (and the onium salt) can be present in such an amount that the reaction of the onium salt and leuco dye occurs during the backflash exposure, but is not desireable. In this case, the color of the floor of the element would change to the color of the color form of the leuco dye. Thus no color contrast would exist between the exposed (raised) areas and the floor of the photopolymerizable layer after treating to form the relief in the element.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements in which the mask was formed digitially, the treating step also removes the mask image (which had been exposed to actinic radiation) and the underlying unexposed areas of the photopolymerizable layer.

Treatment of the photosensitive printing element includes (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and is wicked away by contact with an absorbant material. Dry development may also be called thermal development.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the unexposed portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary, however, typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while in the uncured portions are melt) may be maintained by the pressing the layer and the absorbent material together.

A preferred apparatus to thermally develop the photosensitive element is disclosed by Peterson et al. in U.S. Pat. No. 5,279,697, and also by Johnson et al. in Patent Cooperation Treaty Application No. PCT/US00/24400 filed Sep. 6, 2000 (IM-1289 PCT). The photosensitive element may be placed on a drum or a planar surface in order for thermal treatment to be carried out.

The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. Preferred is a non-woven nylon web.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

The photosensitive printing elements of the present invention can be uniformly post-exposed to ensure that the photopolymerization process is complete and that the element will remain stable during printing and storage. This post-exposure step can utilize the same radiation source as the main overall exposure. Since it is preferred that the leuco dye was consumed by the main overall exposure, no further change in color contrast should occur as a result of post-exposure.

Detackification is an optional post-development treatment that can be applied if the surface of the photosensitive printing element is still tacky, such tackiness not generally being removed in post-exposure. Tackiness can be eliminated by methods well known in the art, such as treatment with bromine or chlorine solutions. Preferably, detackification is accomplished by exposure to radiation sources having a wavelength not longer than 300 nm, as disclosed in European Published Patent Application 0 017927 and Gibson U.S. Pat. No. 4,806,506. Since the detackification step occurs at a different wavelength than the main exposure and the sensitivity of the onium salt is matched to the wavelength of the main exposure, no change in color contrast will occur as a result of detackification step. However, the presence of excess leuco dye in the photopolymerizable layer when detackifying may result in color change.

EXAMPLES

In the following examples, all percentages are by weight unless otherwise noted. CYREL® exposure unit and CYREL® OPTISOL® developing solution are all available from The DuPont Company (Wilmington, Del.).

Example 1

The following mixture was prepared: 76% of a poly(styrene/isoprene/styrene) binder, 12.5% of polyisoprene oil (Mw=30,000), 7% of a diacrylic monomer, 2.5% of a first photoinitiator (Irgacure 651, a benzyldimethylketal from Ciba), 0.5% of a second photoinitiator (Esacure TZT, 4-methyl benzophenone from Lamberti), 0.5% of a thermal stabilizer, 0.25% of a solution of inert dye, 0.5% of iodonium salt (4-([(octyloxy)phenyl]phenyl)-iodonium hexafluoroantimonate), and 0.25% of leuco Crystal Violet Lactone (Pergascript Blue), a blue color promoter. The inert dye provided a pink-red color to the mixture. The first photoinitiator was used for crosslinking the mixture during the main exposure step and had an absorption maximum at 365 nm, and the second photoinitiator was used for the light finishing step and had an absorption maximum at 260 nm.

The mixture was extruded and calendered to form a photosensitive element having a photopolymerizable layer between a support of Mylar® (5 mils) and a coversheet (7 mils). The coversheet included a release layer of Macromelt® polyamide, which was adjacent the photopolymerizable layer. The total thickness of the element was 72 mils. The element obtained was backflash exposed to UV light (365 nm) for 45 seconds (0.75 joules/cm$^2$) on a CYREL exposure unit to form a floor. No change in color was observed for the element as a result of this step, that is, the photopolymerizable layer remained a pink-red color. The coversheet was removed, and an image-bearing negative was placed on a surface of the element opposite the support, and a vacuum was drawn. The element was exposed to UV light (365 nm) through the negative for 12 minutes (12 joules/cm$^2$) on the exposure unit. A change in color was observed between the exposed areas and the unexposed areas of the photopolymerizable layer. The exposed areas (polymerized portions) were dark blue whereas the unexposed areas (unpolymerized portions) remained pink-red.

The element was developed in organic solvent, CYREL® OPTISOL® washout solution for 480 seconds in a CYREL 1002 type processor to remove the unexposed areas and form a relief printing plate. The plate was then dried for 2 hours in a convection oven. The color contrast remained unchanged after these two additional steps. The exposed areas (raised imaged areas) were dark blue and the floor (valley areas) were pink-red. After drying, the plate was further exposed to UV light (254 nm) on the exposure unit for 7 minutes to light finish eliminating any residual tackiness. The contrast between the image areas and the floor areas remained unchanged.

Example 2

The following mixture was prepared: 64.5% of a poly (styrene/butadiene/styrene) binder, 26% of a polybutadiene oil (Mw=20,000), 6% of a diacrylic monomer, 1.65% of a first photoinitiator, 0.5% of a second photoinitiator, 0.5% of a thermal stabilizer, 0.25% of a solution of inert dye, 0.4% of a sulphonium salt (thiophenoxyphenyl diphenylsulphonium hexafluoro antimonate), and 0.2% of a leuco dye grape color promoter (Copykem Magenta). The inert dye provided a pink-red color to the mixture. The first photoinitiator was used to crosslink the mixture during the main exposure step and has an absorption maximum at 365 nm, and the second photoinitiator was used for light finishing step and has an absorption maximum at 260 nm.

Similar to Example 1, the mixture was extruded and calendered to form a photosensitive element having a photopolymerizable layer between the support and the coversheet. The total thickness of the element was 165 mils. The element obtained was backflash exposed to UV light (365 nm) for 75 seconds (1.25 joules/cm$^2$) to form a floor. No change in color was observed during this step, that is, the photopolymerizable layer remained a pink-red color. The coversheet was removed, and an image-bearing negative was placed on a surface of the element opposite the support, and a vacuum was drawn. The element was exposed to UV light (365 nm) through the negative for 20 minutes (20 joules/cm$^2$) on the exposure unit. A change in color was observed between the exposed areas and the unexposed areas of the photopolymerizable layer. The exposed areas (polymerized portions) were dark magenta whereas the unexposed areas (unpolymerized portions) remained pink-red.

The element was developed in organic solvent, CYREL® OPTISOL® washout solution, for 660 seconds in a CYREL 1002 type processor to remove the unexposed areas and form a relief printing plate. The plate was then dried for 2 hours in a convection oven. The color contrast remained unchanged after these two additional steps. After drying, the plate was further exposed to UV light (254 nm) on the exposure unit for 7 minutes to light finish the plate eliminating any residual tackiness. The floor turned slight blue color, but the imaged (polymerized) areas remained dark magenta color and provided good contrast between the raised image areas and the floor.

Example 3

The following mixture was prepared: 76% of a poly(styrene/isoprene/styrene) binder 12.5% of polyisoprene oil (Molecular weight=30,000), 7% of a diacrylic monomer, 2.5% of a first photoinitiator, 0.5% of a second photoinitiator, 0.5% of a thermal stabilizer, 0.25% of a solution of inert dye, 0.25% of an iodonium salt (4-([(octyloxy)phenyl]phenyl)-iodonium hexafluoroantimonate), and 0.5% of a leuco dye of Crystal Violet Lactone (Pergascript Blue), a blue color promoter. The inert dye provided a pink-red color to the mixture. The first photoinitiator was used to crosslink a layer of the mixture during the main exposure step and had an absorption maximum at 365 nm, and the second photoinitiator was used to light finish and had an absorption maximum at 260 nm.

Similar to Example 1, the mixture was extruded and calendered to form a photosensitive element having a photopolymerizable layer between the support and the coversheet. The total thickness of the element was 72 mils. The element obtained was backflash exposed to UV light (365 nm) for 45 seconds (0.75 joules/cm$^2$) to form a floor. No change in color was observed during this step, that is, the photopolymerizable layer remained a pink-red color. The coversheet was removed, and an image-bearing negative was placed on the element and a vacuum was drawn. The element was exposed to UV light (365 nm) for 12 minutes (12 joules/cm$^2$) on the exposure unit. A change in color was observed between the exposed areas and the unexposed areas of the photopolymerizable layer. The exposed areas (polymerized portions) were blue whereas the unexposed areas (unpolymerized portions) remained pink-red.

Similar to Example 1, the element was developed in organic solvent and then dried for 2 hours in convection oven to form a relief printing plate. The color contrast remained unchanged after these two additional steps. After drying, the plate was further exposed to UV light (254 nm) on the exposure unit for 7 minutes to light finish. The contrast between the exposed areas and unexposed areas disappeared. Both the exposed areas and the floor areas turned blue. In this example, it is believed that not all the leuco dye was consumed during the main exposure step. The remaining leuco dye further reacted during the light finishing step (254 nm) and changed color of the floor. This demonstrated the requirement have the effective amount of the onium salt in greater amount than the leuco dye.

Example 4

The following mixture was prepared: 76% of a poly(styrene/isoprene/styrene) binder, 12.5% of polyisoprene oil (Mw=30,000), 7% of a diacrylic monomer, 2.5% of a first photoinitiator (Irgacure 651), 0.5% of a second photoinitiator (Esacure TZT), 0.5% of a thermal stabilizer, 0.25% of a solution of inert dye, 0.5% of iodonium salt (4-([(octyloxy)phenyl]phenyl)-iodonium hexafluoroantimonate), and 0.25% of leuco dye, 6'-(diethylamino)-3'-methyl-2'-phenylaminospiro[isobenzofuran-1-(3H), 9'-[9H]xanthen]-3-one (which is black/dark brown in its color form). The inert dye provided a pink-red color to the mixture. The first photoinitiator was used for crosslinking the mixture during the main exposure step and had an absorption maximum at 365 nm, and the second photoinitiator was used for the light finishing step and had an absorption maximum at 260 nm.

Similar to Example 1, the mixture was extruded and calendered to form a photosensitive element having a photopolymerizable layer between a support of Mylar® (5 mils) and a coversheet (7 mils). The coversheet included a release layer of Macromelt® polyamide, which was adjacent the photopolymerizable layer. The total thickness of the element was 72 mils.

The element obtained was backflash exposed to UV light (365 nm) for 45 seconds (0.75 joules/cm$^2$) on a CYREL exposure unit to form a floor. No change in color was observed for the element as a result of this step, that is, the photopolymerizable layer remained a pink-red color. The coversheet was removed, and an image-bearing negative was placed on a surface of the element opposite the support, and a vacuum was drawn. The element was exposed to UV light (365 nm) through the negative for 12 joules (12 joules/cm$^2$) on the exposure unit. A change in color was observed between the exposed areas and the unexposed areas of the photopolymerizable layer. The exposed areas (polymerized portions) were dark brown whereas the unexposed areas (unpolymerized portions) remained pink-red. Due to the interference of the color formation with the polymerization process, the exposed areas were soft and not fully crosslinked.

The element was developed in organic solvent, CYREL OPTISOL washout solution for 480 seconds in a CYREL 1002 type processor to remove the unexposed areas and form a relief printing plate. The plate was then dried for 2 hours in a convection oven. The color contrast remained unchanged after these two additional steps, with exposed areas dark brown and unexposed areas (the floor) pink-red, but some of the exposed features were lost in the developing step due to the incomplete polymerization of the plate. After drying, the plate was further exposed to UV light (254 nm) on the exposure unit for 7 joules to light finish eliminating any residual tackiness. The contrast between the exposed areas (image) and unexposed (floor) areas remain unchanged, but the image areas remained weak and soft.

What is claimed is:

1. A process for making a flexographic printing plate comprising:
   (a) providing a photosensitive element comprising a support and a photopolymerizable elastomeric layer on the support, the photopolymerizable layer comprising a binder, at least one monomer, a photoinitiator, an onium salt and a leuco dye, wherein the onium salt is present in greater reactive amount than the leuco dye and the leuco dye is 0.1 to 0.3% by weight, based on the total weight of the components in the photopolymerizable layer;
   (b) imagewise exposing the photopolymerizable layer to actinic radiation forming polymerized portions and unpolymerized portions in the layer;
   (c) treating the element of (b) to remove the unpolymerized portions and form a relief surface having raised areas; and prior to treating step (c), backflash exposing the photopolymerizable layer through the support to actinic radiation to form a floor that contrasts in color with the raised areas of the relief surface.

* * * * *